United States Patent
Heidemann et al.

(10) Patent No.: US 10,663,544 B2
(45) Date of Patent: May 26, 2020

(54) METHOD AND MAGNETIC RESONANCE APPARATUS FOR QUIET ECHO-PLANAR IMAGING

(71) Applicant: Siemens Healthcare GmbH, Erlangen (DE)

(72) Inventors: Robin Heidemann, Litzendorf (DE); Patrick Liebig, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 80 days.

(21) Appl. No.: 15/916,464

(22) Filed: Mar. 9, 2018

(65) Prior Publication Data

US 2018/0259605 A1    Sep. 13, 2018

(30) Foreign Application Priority Data

Mar. 9, 2017  (DE) .................. 10 2017 203 936

(51) Int. Cl.
*G01R 33/561*   (2006.01)
*G01R 33/48*    (2006.01)
(Continued)

(52) U.S. Cl.
CPC ..... *G01R 33/4816* (2013.01); *G01R 33/3854* (2013.01); *G01R 33/4826* (2013.01); *G01R 33/50* (2013.01); *G01R 33/5616* (2013.01)

(58) Field of Classification Search
CPC ............ G01R 33/4816; G01R 33/3854; G01R 33/50; G01R 33/5616; G01R 33/4818–4826

(Continued)

(56) References Cited

U.S. PATENT DOCUMENTS 9,116,219 B1 *   8/2015  Posse ............... G01R 33/5608
2006/0033492 A1 * 2/2006  Van Den Brink .................. G01R 33/5615
                                                        324/307

(Continued)

OTHER PUBLICATIONS

Uecker, et al.: "Berkeley Advanced Reconstruction Toolbox"; Proc. Intl. Soc. Mag. Reson. Med.; vol. 23; p. 2486;(2015).

(Continued)

*Primary Examiner* — Patrick Assouad
*Assistant Examiner* — Demetrius R Pretlow
(74) *Attorney, Agent, or Firm* — Schiff Hardin LLP

(57) ABSTRACT

In a method and magnetic resonance (MR) apparatus for echo-planar acquisition of MR images using multiple reception coils, an RF excitation pulse is radiated to generate transverse magnetization, and a temporal sequence of a readout gradient is activated with alternating positive and negative values, thereby producing MR signal echoes. Multiple phase-encoding gradients are activated in a temporal sequence with a value of the phase-encoding gradients being maximum when a value of the readout gradients is minimum, and vice versa. A time period during which a single phase-encoding gradient is applied is at least a quarter of a time interval between two MR signal echoes. The MR signal echoes are read with the multiple reception coils in a trajectory in k-space, continuously without interruption during the readout gradient. The trajectory does not completely fill k-space with raw data in an edge region according to the Nyquist condition.

11 Claims, 4 Drawing Sheets

(51) Int. Cl.
*G01R 33/385* (2006.01)
*G01R 33/50* (2006.01)

(58) Field of Classification Search
USPC .......................................................... 324/307
See application file for complete search history.

(56) References Cited

U.S. PATENT DOCUMENTS

| | | | | |
|---|---|---|---|---|
| 2006/0232273 | A1* | 10/2006 | Takizawa | G01R 33/4824 324/309 |
| 2009/0091322 | A1* | 4/2009 | Posse | G01N 24/08 324/307 |
| 2009/0267602 | A1* | 10/2009 | Hardy | G01R 33/3415 324/309 |
| 2010/0237865 | A1* | 9/2010 | Stemmer | G01R 33/5611 324/309 |
| 2011/0175610 | A1* | 7/2011 | Griswold | G01R 33/4824 324/309 |
| 2011/0260726 | A1* | 10/2011 | Techavipoo | G01R 33/246 324/309 |
| 2012/0224757 | A1* | 9/2012 | Gross | G01R 33/56563 382/131 |
| 2012/0257806 | A1* | 10/2012 | Sheltraw | A61B 5/055 382/131 |
| 2012/0313640 | A1* | 12/2012 | Pfeuffer | A61B 5/055 324/309 |
| 2012/0313641 | A1 | 12/2012 | Labadie et al. | |
| 2013/0271139 | A1* | 10/2013 | Grodzki | G01R 33/543 324/314 |
| 2014/0197834 | A1 | 7/2014 | Porter et al. | |
| 2014/0375314 | A1 | 12/2014 | Buckner et al. | |
| 2015/0097565 | A1* | 4/2015 | Basha | G01R 33/4824 324/322 |
| 2015/0241538 | A1* | 8/2015 | Lu | G01R 33/56509 600/419 |
| 2017/0035319 | A1* | 2/2017 | Zhao | G01R 33/5611 |
| 2017/0234957 | A1* | 8/2017 | Zho | G01R 33/5611 324/309 |
| 2018/0156884 | A1 | 6/2018 | Heidemann et al. | |

OTHER PUBLICATIONS

Griswold, et al.: Generalized Autocalibrating Partially Parallel Acquisitions (GRAPPA): Magnetic Resonance in Medicine; vol. 47; pp. 1202-1210; (2002).
Heidemann,. et al.: "Fast method for ID non-Cartesian parallel imaging using GRAPPA"; Magnetic Resonance in Medicine; vol. 57; pp. 1037-1046; (2007).
Uecker, et. al.: "ESPIRiT—An Eigenvalue Approach to Autocalibrating Parallel MRI: Where SENSE Meets GRAPPA"; Magnetic Resonance in Medicine; vol. 71; pp. 990-1001; (2014).
Schmitter, et. al.: "Silent echoplanar imaging for auditory fMRI"; Proc. Intl. Soc. Mag. Reson. Med.: E , vol. 16; p. 2381; (2008).
Ravicz, et al.: Acoustic noise during functional magnetic resonance imaging a); NIH Public Access; vol. 108, No. 4; pp. 1683-1696; (2000).
Porter, et al.: "High Resolution Diffusion-Weighted Imaging Using Readout-Segmented Echo-Planar Imaging, Parallel Imaging and a Two-Dimensional Navigator-Based Reacquisition"; Magnetic Resonance in Medicine; vol. 62; pp. 468-475 ; (2009).
Lustig, et. al.: "SPIRiT: Iterative Self-consistent Parallel Imaging Reconstruction From Arbitrary k-Space";: Magnetic Resonance in Medicine; vol. 64; pp. 457-471; (2010).
Cho, et. al.: "Effects of the Acoustic Noise of the Gradient Systems on fMRI: A Study on Auditory, Motor, and Visual Cortices"; Magnetic Resonance in Medicine; vol. 39; pp. 331-335; (1998).
Peelle, et al.: "Evaluating an acoustically quiet EPI sequence for use in fMRI studies of speech and auditory processing"; NeuroImage: vol. 52; pp. 1410-1419; (2010).
Schmitter,.et al.: "Silent echo-planar imaging for auditory FMRI"; Magn. Reson Mater Phy; vol. 21; pp. 317-325; (2008).
Mansfield,: "Multi-planar image formation using NMR spin echoes"; J. Phys. C: Solid State Phys.; vol. 10; pp. 55-58; (1977).

\* cited by examiner

METHOD AND MAGNETIC RESONANCE APPARATUS FOR QUIET ECHO-PLANAR IMAGING

BACKGROUND OF THE INVENTION

Field of the Invention

The present invention concerns a method for acquiring magnetic resonance (MR) images with the echo-planar technique in an MR system with multiple reception coils. The invention further concerns the MR apparatus and an electronically readable data carrier that implement such a method.

Description of the Prior Art

With echo-planar imaging (EPI), the entire raw data space (k-space) is sampled (filled with data entries) after a single excitation by a radio-frequency (RF) excitation pulse. The rapid switching of gradients required for this generates a high noise level. This high noise level causes discomfort to examining personnel and in the case of functional imaging (fMRI) of the auditory cortex, causes the activation measured with fMRI to be uncorrelated with the intended audio stimulation. In the case of a standard echo-planar imaging sequence, phase-encoding gradients with short triangular pulse shapes, so-called blips, are activated. In the case of accelerated EP acquisitions, these blips are larger and so make a greater contribution to the noise level. Usually, no data is acquired for the duration of the blips, thus reducing efficiency.

In order to reduce the noise volume of echo-planar imaging to some extent, sinusoidal readout gradients with a very narrow frequency spectrum are used. This makes it possible to optimize the frequency of the readout gradient such that it is significantly separated from the acoustic resonance spectrum of the gradient system. Due to the sinusoidal readout gradient, it is necessary to correct the raw data acquired before applying the two-dimensional FFT in the read-out direction. It is furthermore possible to use a constant phase-encoding gradient in addition to a sinusoidal readout gradient. The constant phase-encoding gradient is optimal with respect to noise generation, since no switching cycles take place during data acquisition. A drawback here is that the data acquired do not lie on a Cartesian grid, and so it is not possible to use Cartesian image reconstruction methods and Cartesian parallel imaging methods. For this reason, although sinusoidal readout gradients are used with so-called quiet EPI sequences, this is only in combination with blip phase-encoding gradients.

DE 10 2013 100 349 A1 describes an EPI method with a zigzag type trajectory, wherein data are continuously read out and wherein Cartesian parallel imaging methods are used simultaneously. However, this method has the disadvantage that, even at relatively low acceleration factors of two, visible artifacts and intensified noise occur in the MR images.

SUMMARY OF THE INVENTION

An object of the present invention is to provide a method for acquiring MR images with the echo-planar technique, which is quieter than standard EPI methods and with which artifacts and noise are minimized with incomplete acquisition (undersampling) of the raw-data space (domain).

The method according to the invention is provided for acquiring MR images with the echo-planar technique in an MR apparatus with multiple reception coils. An RF excitation pulse is radiated that produces transverse magnetization of nuclear spins. Furthermore, a temporal sequence of a readout gradient is activated with alternating positive and negative values, as result of which MR signal echoes are generated. In addition, multiple phase-encoding gradients are activated in a temporal sequence such that a value of each phase-encoding gradient is maximum when a value of the readout gradient is minimum, and the value of each phase-encoding gradients is minimum when the value of the readout gradient is maximum. The time period during which one single phase-encoding gradient is activated is selected so as to be at least a quarter of a time interval between two MR signal echoes. Finally, the MR signal echoes are read out the multiple reception coils and are entered along a trajectory in the raw-data space, with the signal echoes being read out substantially continuously without interruption during the activation of the readout gradients. The trajectory is selected such that, at least in parts of the raw data space, it does not completely fill the raw-data space with raw data according to the Nyquist condition.

To reduce the noise volume, the phase-encoding gradients are selected in accordance with the invention so as to be much longer than conventionally used blips. While these conventional blips typically only had a time period of a tenth of the time interval between two MR signal echoes, in accordance with the invention, the activation of the phase-encoding gradients occupies at least a quarter of the time interval between two MR signals. This enables the use of phase-encoding gradients with a lower amplitude. The activation according to the invention of the phase-encoding and readout gradients relative to one another causes the raw-data space to be filled with signals in a non-Cartesian manner.

Herein, the phase-encoding gradients can be switched such that the value of a phase-encoding gradient changes in a triangular shape.

The activation of the phase-encoding gradients and readout gradients relative to one another with the maximum strength of the one gradient and the minimum strength of the other gradient, and the continuous signal read-out, cause the trajectory in the raw-data space to no longer Cartesian. It is not possible to use Cartesian parallel imaging methods to read out the signals; iterative non-Cartesian methods are preferred.

The MR signal echoes in the trajectory can be acquired such that the interval between two raw-data points in the direction of the readout gradient is smaller than that required by the Nyquist condition. The trajectory, and hence the strengths of the phase-encoding and readout gradients, can be selected such that the Nyquist criterion is satisfied in the center of k-space, and all points in the central region lie on a Cartesian grid. This central region is defined by no phase-encoding gradient activated for the date entered therein. In addition, the trajectory is optimized such that deviations from a Cartesian trajectory, which are an inevitable consequence of continuous data acquisition, lie at the edge of k-space. These edge points have to be corrected and this ultimately results in increased noise in this frequency range. However, the signal is lower at the edge, as result of which the artifacts that occur are very small. This ultimately results in lower noise in the image. Furthermore, it is noted that, at the edge, the trajectory passes more quickly through k-space in the phase-encoding direction than in the middle. The result of this is that, in the case of temporally constant read-out intervals, there are fewer points at the edge of k-space in the phase-encoding direction than in the middle. This minimizes the number of points to be corrected, as a result of which the noise level in the resulting image can be ultimately reduced. The time period during which one single phase-encoding gradient is applied can be at least a quarter of the interval between two MR signal echoes and up to a whole interval between two MR signal echoes. If the time interval is half the interval between two signal echoes, the noise reduction is relatively high, however, the signal-to-noise ratio is not yet so low that it is no longer possible to achieve a satisfactory image quality.

The temporal sequence of the readout gradient can have a sinusoidal shape, however, a trapezoidal shape of the readout gradient is possible with in each case positive and negative gradient segments for the generation of the signal echoes.

The MR signal echoes are preferably acquired with the multiple reception coils during the entire duration for which the phase-encoding gradients are activated.

This enables the echo-planar imaging to be further accelerated since there are virtually no dead times without signal acquisition.

One possible application of the above-described echo-planar imaging method is functional MR imaging. In the case of functional MR imaging, the noise disrupts the standard echo-planar sequence as it influences the activation in the brain and this ultimately falsifies the results.

The invention also concerns an associated magnetic-resonance system designed to acquire MR images with the echo-planar technique, wherein the MR apparatus has a scanner with multiple reception coils, a control computer and a memory, wherein the memory stores control code that can be executed by the control computer so as to cause the MR apparatus to execute the above-described steps.

The present invention also encompasses a non-transitory, computer-readable data storage medium encoded with programming instructions (program code) that, when the storage medium is loaded into a computer or computer system of a magnetic resonance apparatus, cause the computer or computer system to operate the MR apparatus in order to implement any or all embodiments of the method according to the invention, as described above.

The above-described features and the features described below can be used not only in the explicitly described combination, but also in other combinations unless explicitly stated otherwise. The different features can also be used individually.

DESCRIPTION OF THE PREFERRED EMBODIMENTS

Figure 1:
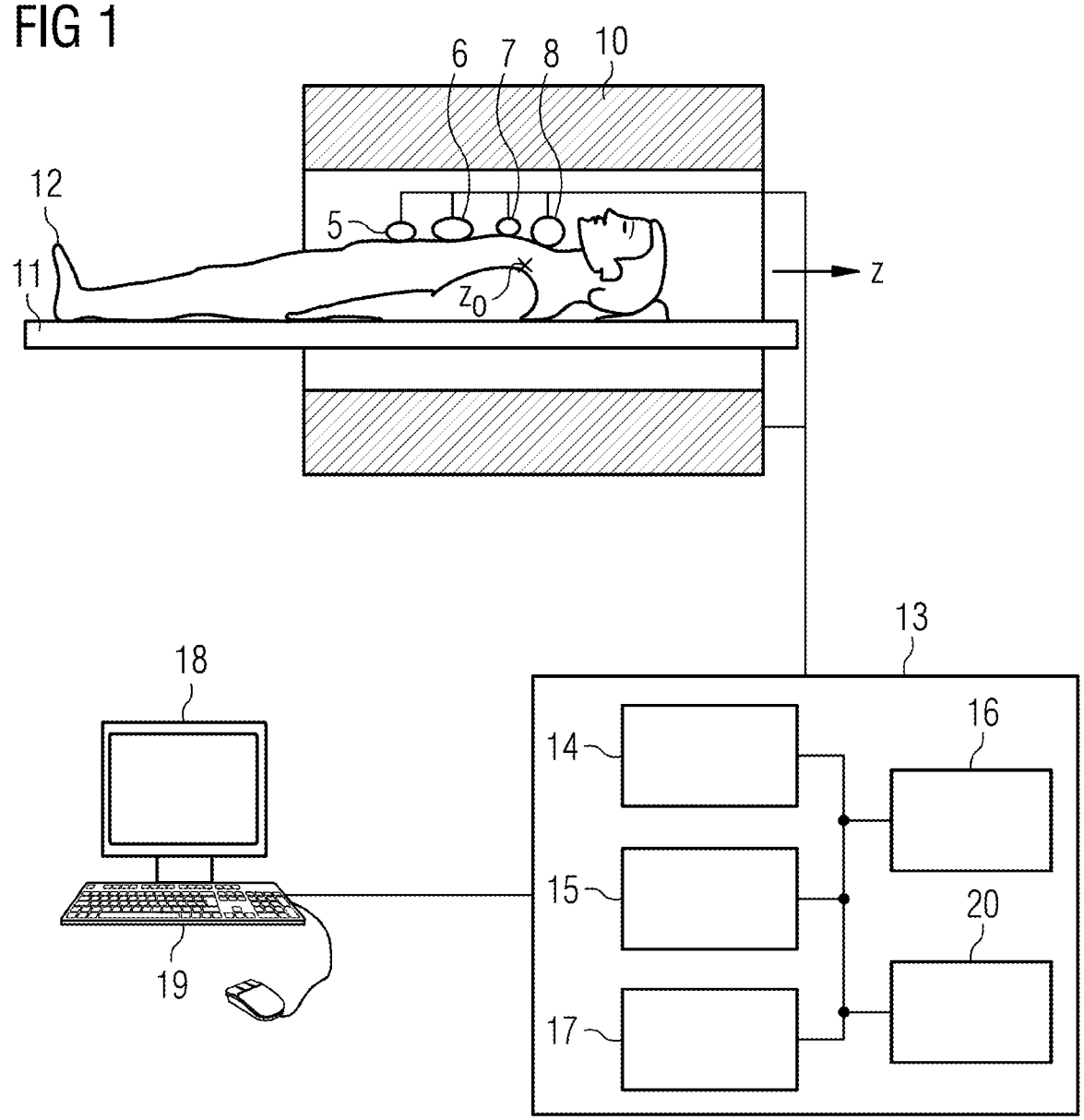
FIG. 1 schematically illustrates an MR apparatus with which the echo-planar technique according to the invention is executed with a lower noise development than the standard echo-planar sequence with the same image quality.

FIG. 1 is a schematic representation of an MR apparatus with which MR images can be acquired according to the invention using the echo-planar technique with satisfactory image quality and low noise development in a short acquisition time. The magnetic-resonance apparatus has a scanner with a magnet 10 that generates a polarization field $B_0$, wherein a person to be examined lying on a bed 11 represents the examination object 12, which is moved into the isocenter $Z_0$ of the magnet 10 in order to acquire spatially encoded magnetic resonance signals from the examination object at that location. The radiation of radio-frequency pulses and activation of magnetic field gradients can disrupt the magnetization generated by the polarization field Bo by deflecting the nuclear spins from the steady state position. The currents induced in reception coils 5-8 during return of the nuclear spins to the steady state position (relaxation) can be converted into magnetic resonance signals. The general manner of operation for creating MR images by detecting the magnetic resonance signals, in particular with parallel imaging, is known to those skilled in the art, and so a more detailed description is not necessary herein.

The magnetic resonance apparatus has a control computer 13, which is used to control the MR system. The control computer 13 has a gradient controller 14 that controls and activates magnetic field gradients, and an RF controller 15 that generates RF pulses for deflecting the nuclear spins out of the steady state position. The RF controller 5 can be a multi-channel controller or a single-channel controller. A memory 16 stores imaging sequences required for the acquisition of the MR images and all further control information necessary to carry out the invention. An image sequencer 17 controls the image acquisition and hence, dependent on the selected imaging sequence, the sequence of the magnetic field gradients, the RF pulses and the receiving intervals of the MR signals. The image sequencer 17 also controls the gradient controller 14 and the RF controller 15 and the operation of the reception coils 6-8. MR images can be calculated in a reconstruction processor 20 and displayed on a display monitor 18. An operator can control the MR apparatus via an input unit 19.

Figure 2:
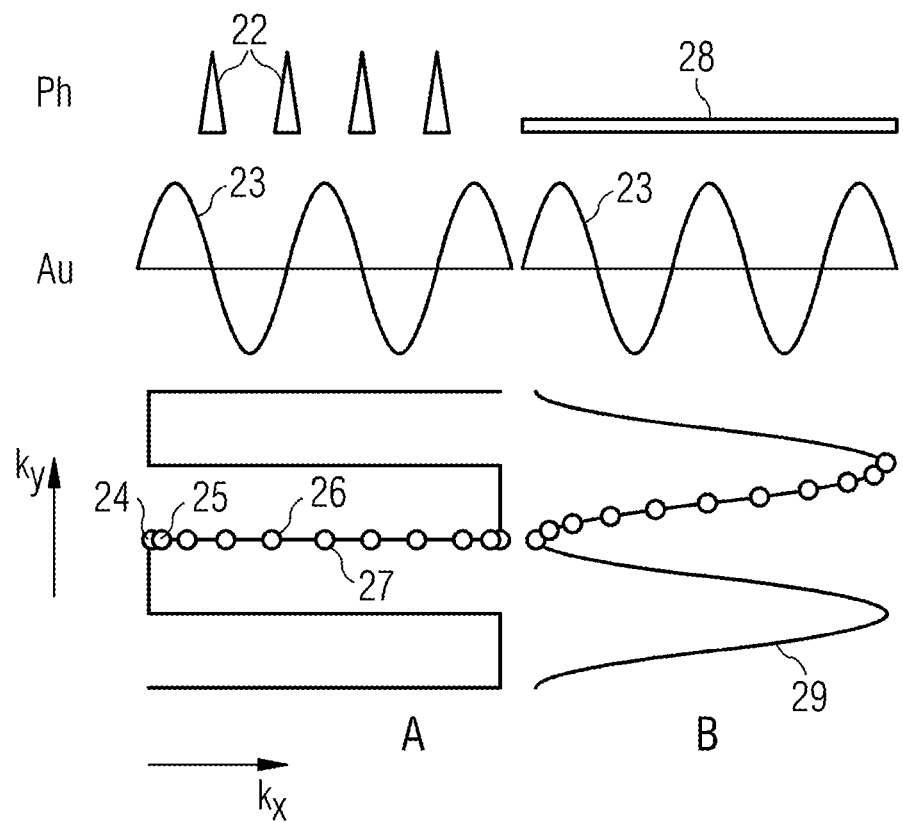
FIG. 2 schematically illustrates the activation of read-out and phase-encoding gradients with standard echo-planar imaging with short triangular (left) and continuous (right) phase-encoding gradients according to the prior art.

FIG. 2 is a schematic representation of how the phase-encoding gradients and readout gradients can be activated with the echo-planar technique according to the prior art. The left side of FIG. 2 depicts how the short triangular phase-encoding gradients 22, the so-called blips, are activated in the phase-encoding direction Ph while a sinusoidal readout gradient 23 is used in the read-out direction. Shown below, is the associated trajectory in the raw-data space, wherein the activation of the magnetic-field gradients shown at the top of FIG. 2 causes the raw-data points 24 and 25 in an outer region to lie in denser proximity to one other than the raw-data points 26 and 27 in a central region. This is based on the switching of the gradients used. The right part of FIG. 2 again shows the same sinusoidal readout gradient, while the phase-encoding gradient 28 is connected continuously. The resulting trajectory 29 is shown below, wherein once again the individual raw-data points have a smaller interval at the edge in the read-out direction than in the center. Although the method shown on the right in FIG. 2 can reduce the noise on acquisition, it is evident that even with small acceleration factors, when the raw-data space are not acquired completely, artifacts result and intensified noise occurs in the image.

Figure 3:
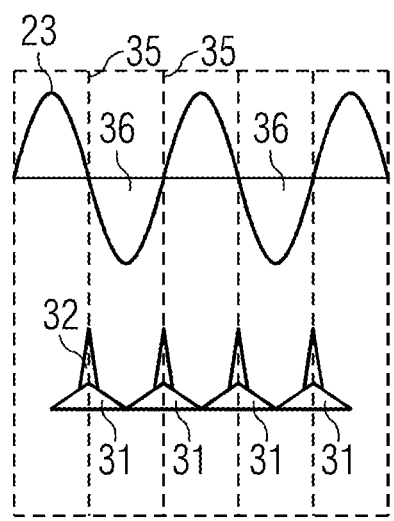
FIG. 3 schematically illustrates the activation profile of the phase-encoding gradients and the readout gradient relative to one another for the echo-planar technique according to the invention with much longer phase-encoding gradients with lower amplitude compared to phase-encoding gradients according to the prior art.
Figure 4:
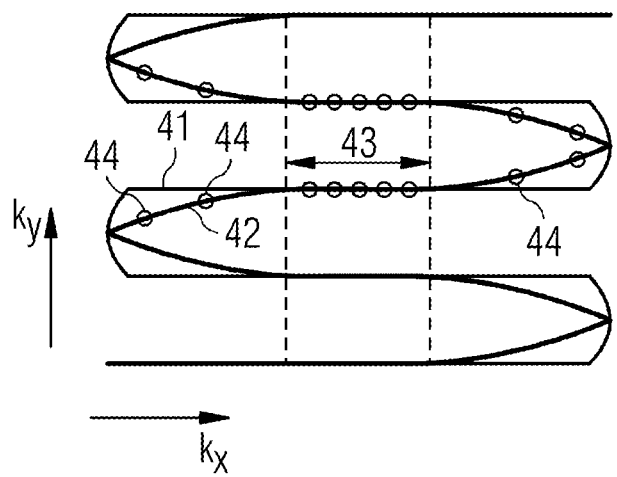
FIG. 4 schematically illustrates the trajectory for the acquisition of the raw-data space during the echo-planar imaging according to the invention.

FIG. 3 is a schematic representation of the activation of the read-out and phase-encoding gradients with the present invention. The readout gradient is again activated in a sinusoidal shape as shown in the chronological representation. The phase-encoding gradient used now is triangular phase-encoding switching 31 with multiple phase-encoding gradients. By comparison, also depicted are the blips 32 which have a chronological length corresponding to the phase-encoding gradients 22 in FIG. 2. The blips 32 are only depicted as a comparison of the chronological length of the blips relative to the phase-encoding gradients 31; only the gradients 31 are activated. Generally, the gradients 31 are at least 5-7 times or 10 times as long as the blips 32. Since the area under both gradients is the same, the gradient strength with the gradients 31 is correspondingly lower. In example depicted in FIG. 3, the phase-encoding gradients, which here have a triangular shape, have the same chronological length as an echo interval. Herein, it is evident that, at the time points 35 in which the phase-encoding gradient is maximum, the readout gradient is minimum, while, at the time points 36 in which the readout gradient is maximum in size, the phase-encoding gradient is minimum. This gradient switching results in a trajectory such as that shown in FIG. 4. The trajectory 41 is obtained when the blips 32 in FIG. 3 are used as phase-encoding gradients and the trajectory 42 is obtained when the phase-encoding gradients 31 in FIG. 3 are used, wherein the phase-encoding gradients in the example in FIG. 4 have about half the echo interval so that, in a central region 43, at the time points in which no phase-encoding gradient is switched, the raw-data points lie on a Cartesian grid. Furthermore, it is recognizable that, outside the central region 43, where they do not lie on a Cartesian grid, the raw-data points 44 are present in the phase-encoding direction with a lower density than in the central region 43. It is recognizable from FIG. 4 that, the longer the phase-encoding gradients, the greater the difference of the trajectory from a Cartesian trajectory and the higher the rise at the edge of the raw-data space. It is in particular recognizable that no rise in the middle of the raw-data space is used with the trajectory 42 according to the invention. In the read-out direction, the kx direction in FIG. 4, this results in an interval of the raw-data points in the kx direction, which is smaller than at the edge where the rise is greater.

Raw data acquired in this way can now be reconstructed by iterative, non-Cartesian methods such as, for example, SPIRiT and ESPIRiT. The reconstruction methods ESPIRiT and SPIRiT are known and will not be explained in any more detail. For example, the method ESPIRiT is described in "An Eigenvalue Approach to Autocalibrating Parallel MRI: where SENSE meets GRAPPA" in MRM, 71:990-1001, 2014. SPIRiT is described in MRM 64:457-471, 2010 with the title "Iterative Self-consistent Parallel Imaging Reconstruction From Arbitrary k-Space".

Figure 5:
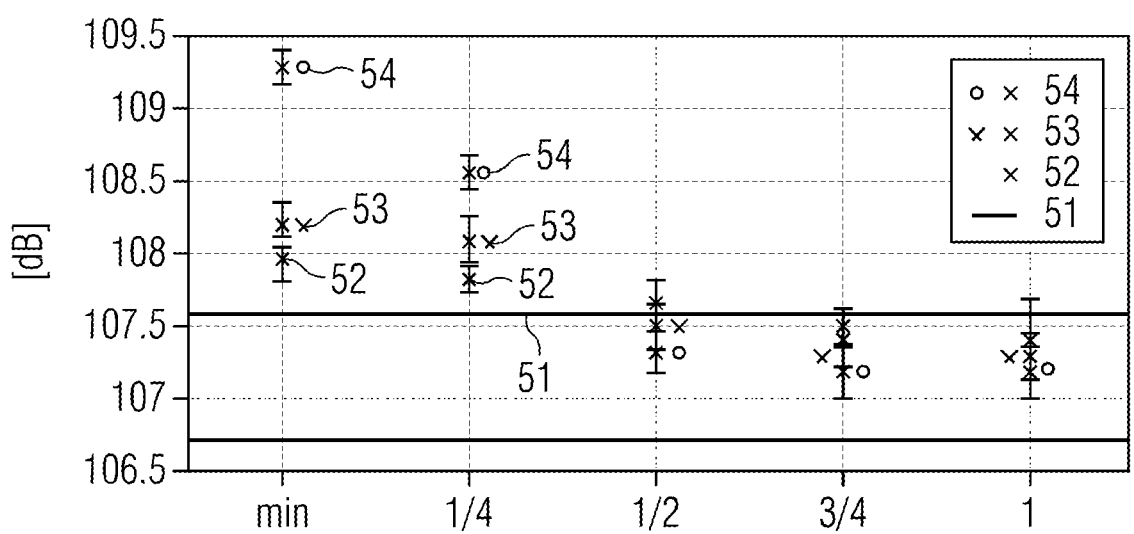
FIG. 5 shows noise measurements during echo-planar imaging as a function of the length of the phase-encoding gradient.

FIG. 5 shows acoustic noise measurements, for example at 120 measuring points with a scanning rate of 250 milliseconds as a function of the length of the switching of the phase-encoding gradients from a minimum duration to a duration of an echo interval for different acceleration factors. The values 54 show the acoustic noise for an acceleration factor 4, the values 53 for an acceleration factor 3 and the values 52 for an acceleration factor 2. Furthermore, 51 shows the noise level value without the use of a phase-encoding gradient. As expected, the noise is greatest with a minimum length of the phase-encoding gradient and a high acceleration factor. If, however, the length of the phase-encoding gradient is extended to at least half of the echo interval, substantially the same noise is achieved as without a phase-encoding gradient.

Figure 6:
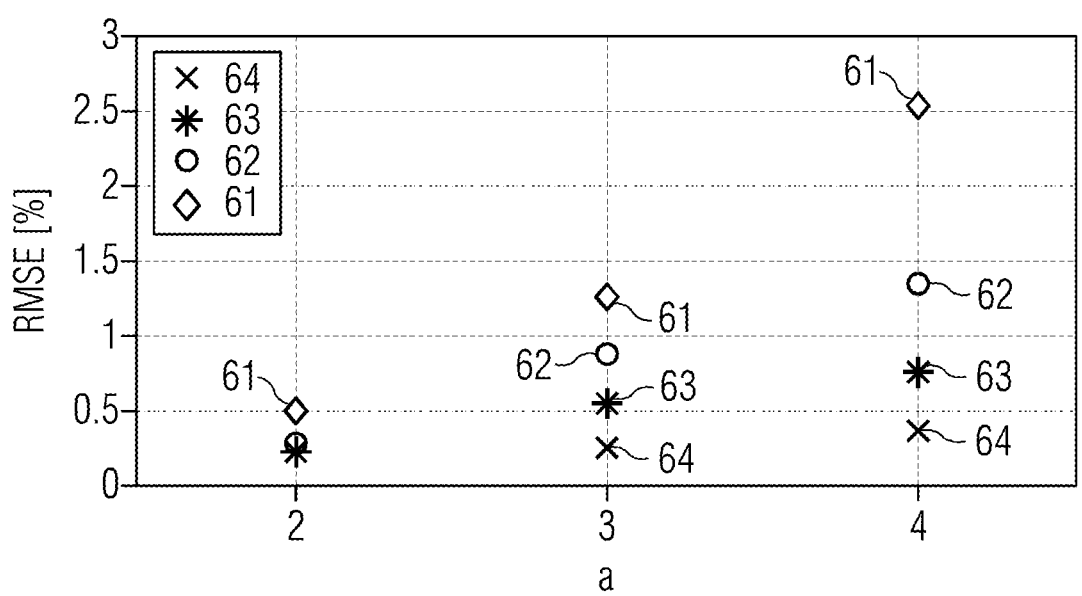
FIG. 6 is a diagram schematically depicting image quality as a function of acceleration factors for different lengths of the phase-encoding gradients.

FIG. 6 show the percentage change in the image quality, i.e. the so-called root-mean-square error (RMSE), for different acceleration factors a and different lengths of the phase-encoding gradients. It can be recognized in FIG. 6 that the image quality is best with the minimum length of the phase-encoding gradients, i.e. the minimum length possible with the MR system, as depicted by the points 64. The upper points 61 correspond to the profile with constant phase-encoding gradients. The points 62 are measured with a length of the phase-encoding gradient corresponding to a whole echo interval, the points 63 with a length corresponding to half an echo interval. It can now be recognized in FIG. 6 that the points 62 have a lower error when using time period of half the echo length for the phase-encoding gradients than with a constant phase-encoding gradient, wherein the error only increases slightly with additional acceleration when the temporal profile corresponds to an echo interval, as shown by the points 63.

The present invention offers a good compromise between the length of the activation of the phase-encoding gradients for reducing the acoustic noise during acquisition and image quality, which deteriorates as the duration of the phase-encoding gradients increases. For example, a good compromise is achieved when the duration of the phase-encoding gradients corresponds to half the echo interval of the MR signal echoes. This achieves a similar noise nuisance as with echo-planar techniques with constant phase-encoding gradients and similar image quality as with the use of very short blips in the phase-encoding direction. Improved image quality is in particular achieved in that the activation of the phase-encoding gradients according to the invention relative to the readout gradients achieves higher density of the raw-data points in the center and lower density at the edge. Furthermore, the continuous data acquisition enables a reduction in the acquisition time as result of which there is an overall improvement in the signal-to-noise ratio and a reduction in the typical distortion during the echo-planar technique.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A method for operating a magnetic resonance (MR) apparatus in order to acquire MR raw data, said method comprising:

from a computer, operating an MR apparatus, comprising a plurality of radio-frequency (RF) reception coils, in order to execute an echo-planar MR data acquisition sequence, including radiating an RF excitation pulse that gives nuclear spins of a subject in the MR apparatus a transverse magnetization;

from said computer, operating said MR apparatus in said echo-planar sequence to activate a readout gradient comprising a temporal sequence of alternating positive and negative gradient values, and thereby producing MR signal echoes, wherein successive MR signal echoes have a time interval therebetween;

from said computer, operating said MR apparatus in said echo-planar sequence to activate a plurality of phase-encoding gradients in a temporal sequence wherein a value of a respective phase-encoding gradient is maximum when an absolute value of the readout gradient is minimum, and an absolute value of a respective phase-encoding gradient is minimum when a value of the readout gradient is maximum, and wherein individual phase-encoding gradients in said temporal sequence are each activated for a time that is at least a quarter of said time interval;

from said computer, operating said MR apparatus in said echo planar sequence to read out said MR signal echoes with said plurality of RF reception coils, and entering said MR signal echoes into a memory organized as k-space, as raw MR data, along a trajectory in k-space wherein said MR signal echoes are read out continuously without interruption during said readout gradient, with said trajectory being configured so that said raw MR data in an edge region of k-space are undersampled according to the Nyquist condition; and from said computer, making the raw MR data in k-space available in electronic form, as a data file.

2. A method as claimed in claim 1 comprising activating said phase-encoding gradients with said value of said respective phase-encoding gradients changing in a triangular shape.

3. A method as claimed in claim 1 comprising configuring said trajectory so that a portion of said trajectory in a central region of k-space causes said MR signal echoes to be entered in k-space as said raw MR data according to a Cartesian grid, and to cause the MR echo signals to be entered into k-space as said raw MR data outside of said central region at respective points in k-space that are not organized as said Cartesian grid.

4. A method as claimed in claim 1 comprising activating said phase-encoding gradients along a phase-encoding direction, and configuring said trajectory so that said MR signal echoes are entered into k-space as said raw MR data in a central region of k-space with a density, in said phase-encoding direction, that is higher than a density outside of said central region.

5. A method as claimed in claim 1 comprising activating said individual phase-encoding gradients during said time being in a range between half of said time interval and an entirety of said time interval.

6. A method as claimed in claim 1 comprising, in said computer, reconstructing MR image data from said MR raw data by executing an iterative non-Cartesian reconstruction algorithm.

7. A method as claimed in claim 1 comprising, from said computer, operating said MR apparatus to activate said readout gradient in said temporal sequence with a shape selected from the group consisting of a sinusoidal shape and trapezoidal shape.

8. A method as claimed in claim 1 comprising, from said computer, operating said MR apparatus in said echo-planar sequence by reading out said MR signal echoes with said plurality of reception coils for an entirety of a duration in which said phase-encoding gradients are activated.

9. A method as claimed in claim 1 comprising, from said computer, operating said MR apparatus in order to execute said echo-planar sequence for functional MR imaging.

10. A magnetic resonance (MR) apparatus comprising:
an MR data acquisition scanner comprising a plurality of radio-frequency (RF) reception coils;
a computer configured to operate said MR data acquisition scanner in order to execute an echo-planar MR data acquisition sequence, including radiating an RF excitation pulse that gives nuclear spins of a subject in the MR apparatus a transverse magnetization;
said computer being configured to operate said MR data acquisition scanner in said echo-planar sequence to activate a readout gradient comprising a temporal sequence of alternating positive and negative gradient values, and thereby producing MR signal echoes, wherein successive MR signal echoes have a time interval therebetween;
said computer being configured to operate said MR data acquisition scanner in said echo-planar sequence to activate a plurality of phase-encoding gradients in a temporal sequence wherein a value of a respective phase-encoding gradient is maximum when an absolute value of the readout gradient is minimum, and an absolute value of a respective phase-encoding gradient is minimum when a value of the readout gradient is maximum, and wherein individual phase-encoding gradients in said temporal sequence are each activated for a time that is at least a quarter of said time interval;
said computer being configured to operate said MR data acquisition scanner in said echo planar sequence to read out said MR signal echoes with said plurality of RF reception coils, and to enter said MR signal echoes into a memory organized as k-space, as raw MR data, along a trajectory in k-space wherein said MR signal echoes are read out continuously without interruption during said readout gradient, with said trajectory being configured so that said raw MR data in an edge region of k-space are undersampled according to the Nyquist condition; and
said computer being configured to make the raw MR data in k-space available in electronic form, as a data file.

11. A non-transitory, computer-readable data storage medium encoded with programming instructions, said storage medium being loaded into a computer system of a magnetic resonance (MR) apparatus comprising a plurality of radio-frequency (RF) reception coils, said programming instructions causing said computer system to:
operate the MR apparatus in order to execute an echo-planar MR data acquisition sequence, including radiating an RF excitation pulse that gives nuclear spins of a subject in the MR apparatus a transverse magnetization;
operate said MR apparatus in said echo-planar sequence to activate a readout gradient comprising a temporal sequence of alternating positive and negative gradient values, and thereby producing MR signal echoes, wherein successive MR signal echoes have a time interval therebetween;
operate said MR apparatus in said echo-planar sequence to activate a plurality of phase-encoding gradients in a temporal sequence wherein a value of a respective phase-encoding gradient is maximum when an absolute value of the readout gradient is minimum, and an absolute value of a respective phase-encoding gradient is minimum when a value of the readout gradient is maximum, and wherein individual phase-encoding gradients in said temporal sequence are each activated for a time that is at least a quarter of said time interval;
operate said MR apparatus in said echo planar sequence to read out said MR signal echoes with said plurality of RF reception coils, and to enter said MR signal echoes into a memory organized as k-space, as raw MR data, along a trajectory in k-space wherein said MR signal echoes are read out continuously without interruption during said readout gradient, with said trajectory being configured so that said raw MR data in an edge region of k-space are undersampled according to the Nyquist condition; and make the raw MR data in k-space available from the computer in electronic form, as a data file.

\* \* \* \* \*